United States Patent
Roh et al.

(10) Patent No.: US 7,332,391 B2
(45) Date of Patent: Feb. 19, 2008

(54) METHOD FOR FORMING STORAGE NODE CONTACTS IN SEMICONDUCTOR DEVICE

(75) Inventors: Il Cheol Roh, Icheon-si (KR); Choon Hwan Kim, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/618,532

(22) Filed: Dec. 29, 2006

(65) Prior Publication Data

US 2007/0259492 A1    Nov. 8, 2007

(30) Foreign Application Priority Data

May 4, 2006    (KR) .................. 10-2006-0040524

(51) Int. Cl.
| H01L 21/8234 | (2006.01) |
| H01L 21/8244 | (2006.01) |
| H01L 21/8242 | (2006.01) |
| H01L 21/20 | (2006.01) |

(52) U.S. Cl. .................. 438/238; 438/253; 438/255; 438/398; 438/397; 438/778; 257/E21.396; 257/E21.009

(58) Field of Classification Search .............. 438/238, 438/239, 253, 255, 397, 398, 778, 243; 257/E21.396, 257/E21.009
See application file for complete search history.

(56) References Cited

U.S. PATENT DOCUMENTS 6,475,855 B1* 11/2002 Fishburn .................. 438/239
6,642,100 B2   11/2003 Yang et al.
6,900,095 B2    5/2005 Yoon
2003/0035313 A1* 2/2003 Lee et al. ................. 365/100
2003/0216056 A1* 11/2003 Yoon ......................... 438/778
2005/0051821 A1* 3/2005 Miki et al. ................ 257/295

FOREIGN PATENT DOCUMENTS

| JP | 08-186111 A | 7/1996 |
| JP | 2000-164704 A | 6/2000 |
| JP | 2004-134692 A | 4/2004 |
| KR | 10-2000-0062440 A | 10/2000 |

* cited by examiner

Primary Examiner—Michael Lebentritt
Assistant Examiner—Mohsen Ahmadi
(74) Attorney, Agent, or Firm—Townsend and Townsend and Crew LLP

(57) ABSTRACT

A method for forming storage node contacts in a semiconductor device includes forming an interlayer dielectric layer on a semiconductor substrate provided with transistors; forming a hydrogen diffusion preventing layer on the interlayer dielectric layer; forming a hard mask layer containing hydrogen atoms on the hydrogen diffusion preventing layer; forming storage node contact holes, which pass through the hydrogen diffusion preventing layer and the interlayer dielectric layer and expose impurity regions of the transistors, by etching the hydrogen diffusion preventing layer and the interlayer dielectric layer using the hard mask layer as an etching barrier layer; and forming the storage node contacts by filling the storage node contact holes with a conductive layer.

16 Claims, 4 Drawing Sheets

METHOD FOR FORMING STORAGE NODE CONTACTS IN SEMICONDUCTOR DEVICE

BACKGROUND OF THE INVENTION

The present invention relates to a method for fabricating a semiconductor device, and more particularly to a method for forming storage node contacts in a semiconductor device.

In a semiconductor memory device including capacitors, such as a dynamic random access memory (DRAM), bit lines are first formed and then the capacitors are formed, so as to increase the effective dimensions of the capacitors. Storage node contacts are formed after the bit lines to electrically connect impurity regions (e.g., source/drain regions) of transistors and storage nodes of the capacitors.

Now, a process for forming storage node contacts will be described. First, landing plug contacts (LPCs) are formed on a semiconductor substrate by forming landing plug contact holes by selectively removing a first dielectric layer from the semiconductor substrate and filling the landing plug contact holes with a conductive layer. The landing plug contacts serve to electrically connect impurity regions of the semiconductor substrate and storage node contacts. Thereafter, storage node contact holes are formed by forming a second dielectric layer on the LPCs and the first dielectric layer and selectively etching the second dielectric layer. Then, the storage node contact holes are filled with a conductive layer. Thereby, the storage node contacts are obtained.

In the above process, the etching of the second dielectric layer for forming the storage node contact holes is performed using a hard mask layer. That is, the hard mask layer is formed on the second dielectric layer, and the second dielectric layer is etched using the hard mask layer as an etching barrier layer. Generally, a polysilicon layer or a nitride layer is used as the hard mask layer. If necessary, a nitride layer containing a hydrogen component may be used as the hard mask layer. The polysilicon layer causes alignment keys not to be optically visible, thus requiring an additional step for alignment. The nitride layer deteriorates the stability of the device due to stress to a lower layer, and causes defects of the device. The nitride layer containing the hydrogen component allows alignment keys to be optically visible so as to omit any additional step for alignment, and alleviates the stress applied to the lower layer. However, the nitride layer containing the hydrogen component causes the hydrogen component to be diffused into the second dielectric layer, and deteriorates electrical characteristics of the device.

SUMMARY OF THE INVENTION

Embodiments of the present invention relate a method for forming storage node contacts in a semiconductor device, in which a silicon-rich oxy-nitride (SRON) layer is used as a hard mask layer.

In one embodiment, a method for forming storage node contacts includes forming a dielectric layer on a semiconductor substrate provided with transistors; forming a hydrogen diffusion preventing layer on the dielectric layer; forming a hard mask layer containing hydrogen atoms on the hydrogen diffusion preventing layer; forming storage node contact holes, which pass through the hydrogen diffusion preventing layer and the dielectric layer and expose impurity regions of the transistors, by etching the hydrogen diffusion preventing layer and the dielectric layer using the hard mask layer as an etching barrier layer; and forming the storage node contacts by filling the storage node contact holes with a conductive layer.

Preferably, the hydrogen diffusion preventing layer is a silicon-rich oxide (SROX) layer.

In this case, the formation of the SROX may be achieved by plasma enhanced chemical vapor deposition.

Preferably, the formation of the SROX using the plasma enhanced chemical vapor deposition is achieved by using $SiH_4$ gas, $N_2O$ gas and $N_2$ gas as reaction gases, maintaining a chamber at a temperature of 350~450° C. and a pressure of 2~4 Torr, and applying an RF power of 400~1,000 W to the chamber so as to form plasma in the chamber.

In this case, preferably, the supply amount of the $SiH_4$ gas is adjusted to 300~500 sccm, and the supply amounts of the $N_2O$ gas and the $N_2$ gas are adjusted to 4,000~6,000 sccm.

Preferably, the hydrogen diffusion preventing layer has a thickness of 100~1,000 Å.

Further, preferably, the hard mask layer containing hydrogen atoms is a silicon-rich oxy-nitride (SRON) layer.

The dielectric layer may be a high density plasma oxide layer.

In accordance with embodiments of the present invention, there is provided a method for forming storage node contacts in a semiconductor device comprising forming a first dielectric layer on a semiconductor substrate provided with transistors; forming landing plug contacts, which pass through the first dielectric layer and contact impurity regions of the semiconductor substrate; forming a second dielectric layer on the landing plug contacts and the first dielectric layer; forming a hydrogen diffusion preventing layer on the second dielectric layer; forming a hard mask layer containing hydrogen atoms on the hydrogen diffusion preventing layer; forming storage node contact holes, which pass through the hydrogen diffusion preventing layer and the second dielectric layer and expose the landing plug contacts, by etching the hydrogen diffusion preventing layer and the second dielectric layer using the hard mask layer as an etching barrier layer; and forming the storage node contacts by filling the storage node contact holes with a conductive layer.

Preferably, the hydrogen diffusion preventing layer is a silicon-rich oxide (SROX) layer.

The hard mask layer containing hydrogen atoms may be a silicon-rich oxy-nitride (SRON) layer.

DESCRIPTION OF THE PREFERRED EMBODIMENTS

Figure 1:
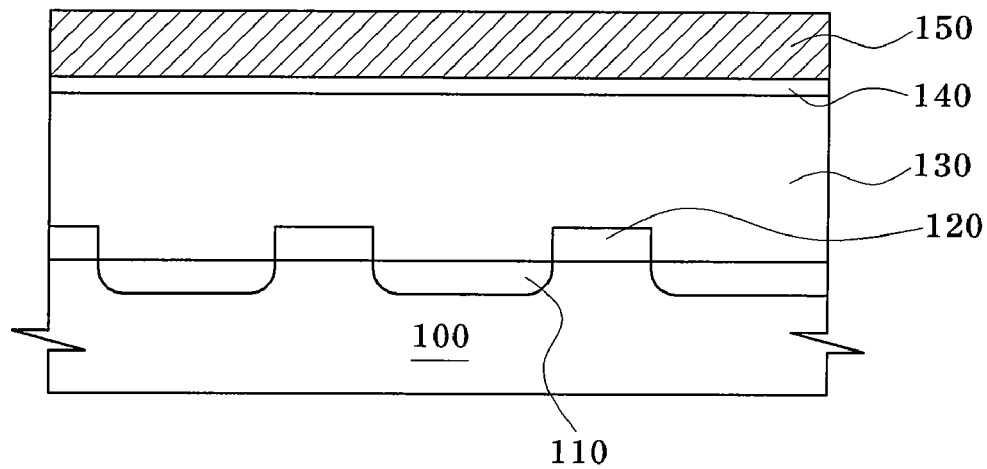
FIGS. 1 to 3 are sectional views illustrating a method for forming storage node contacts in a semiconductor device in accordance with one embodiment of the present invention.
Figure 2:
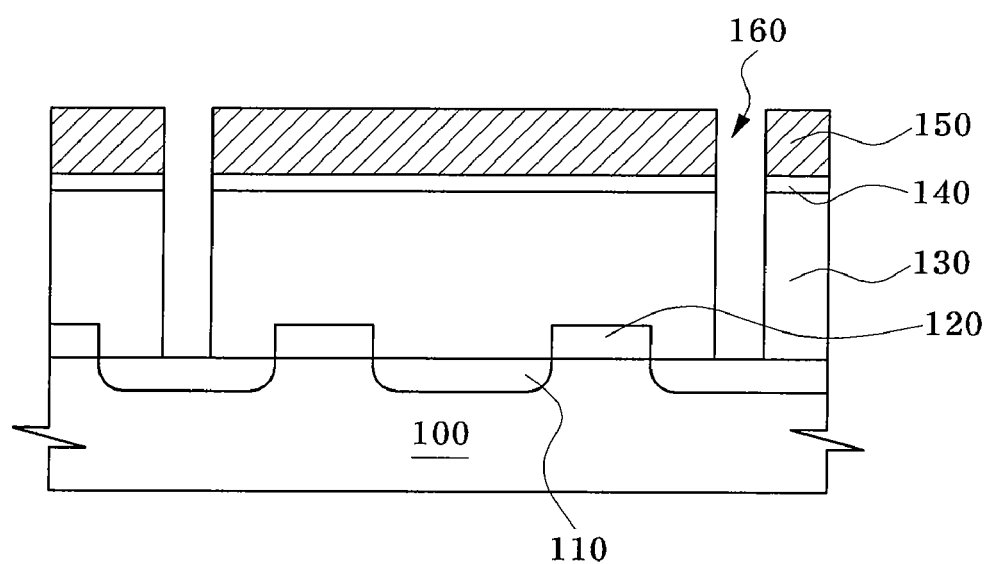
Figure 3:
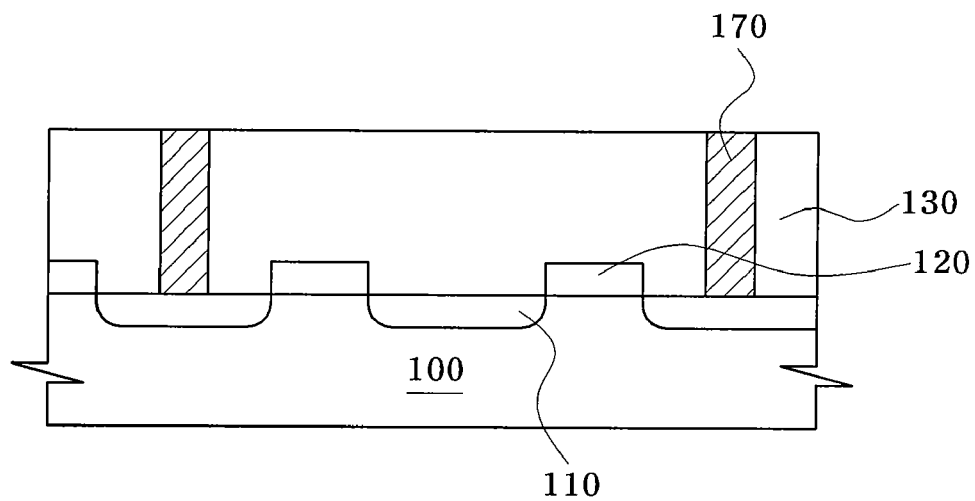

FIGS. 1 to 3 are sectional views illustrating a method for forming storage node contacts in a semiconductor device in accordance with one embodiment of the present invention.

Referring to FIG. 1, a dielectric layer 130 is formed over a semiconductor substrate 100 provided with conductive regions 110. Gate structures 120 of transistors are disposed over the semiconductor substrate 100. The dielectric layer 130 is provided over the gate stacks or structures 120. The conductive regions 110 are source/drain regions of the transistors.

A hydrogen diffusion preventing layer 140 is formed over the dielectric layer 130. The hydrogen diffusion preventing layer 140 has a thickness of approximately 100~1,000 Å. The layer 140 is a silicon-rich oxide (SROX) layer. The SROX layer is formed using plasma enhanced chemical vapor deposition (PE-CVD). More specifically, in the PE-CVD, $SiH_4$ gas, $N_2O$ gas and $N_2$ gas are used as reaction gases, a chamber is maintained at a temperature of approximately 350~450° C. and a pressure of approximately 2~4 Torr, and an RF power of approximately 400~1,000 W is applied to the chamber so as to form plasma in the chamber. The supply amount of the $SiH_4$ gas is adjusted to approximately 300~500 sccm, and the supply amounts of the $N_2O$ gas and the $N_2$ gas are respectively adjusted to approximately 4,000~6,000 sccm.

A hard mask layer 150 containing a large amount of hydrogen atoms is formed over the hydrogen diffusion preventing layer 140. The hard mask layer 150 is a silicon-rich oxy-nitride (SRON) layer. In the present embodiment, the hard mask layer 150 includes about 37.5 to 43 percentage of silicon. Hydrogen atoms remaining in the hard mask layer 150 are residues from the formation of the hard mask layer 150, e.g., from $SiH_4$ gas that is commonly is used to form the hard mask layer 150.

Referring to FIG. 2, the hard mask layer 150 is patterned, thus selectively exposing the surface of the hydrogen diffusion preventing layer 140. The exposed portions of the hydrogen diffusion preventing layer 140 and the exposed portions of the dielectric layer 130 are removed by etching using the patterned hard mask layer 150 as an etch mask. Storage node contact holes 160 are formed. The storage node contact holes 160 expose the conductive regions 110 of the semiconductor substrate 100.

Referring to FIG. 3, the capacitor contact holes 160 are filled with conductive material to form capacitor contacts 170. That is, the capacitor contacts 170 are formed first by depositing a conductive layer (not shown) over the semiconductor substrate 100 and filling the storage node contact holes 160. Then, the conductive layer is then removed, e.g., by using a chemical mechanical polishing (CMP) process until an upper surface of the dielectric layer 130 is exposed. In the present embodiment, the hydrogen diffusion preventing layer 140 and the hard mask layer 150 are removed from the semiconductor substrate 100 prior to the deposition of the conductive layer.

FIGS. 4 to 7 are sectional views illustrating a method for forming storage node contacts in a semiconductor device in accordance with another embodiment of the present invention. In this embodiment, LPCs (landing plug contacts) are used in conjunction with the storage node contacts.

Figure 4A:
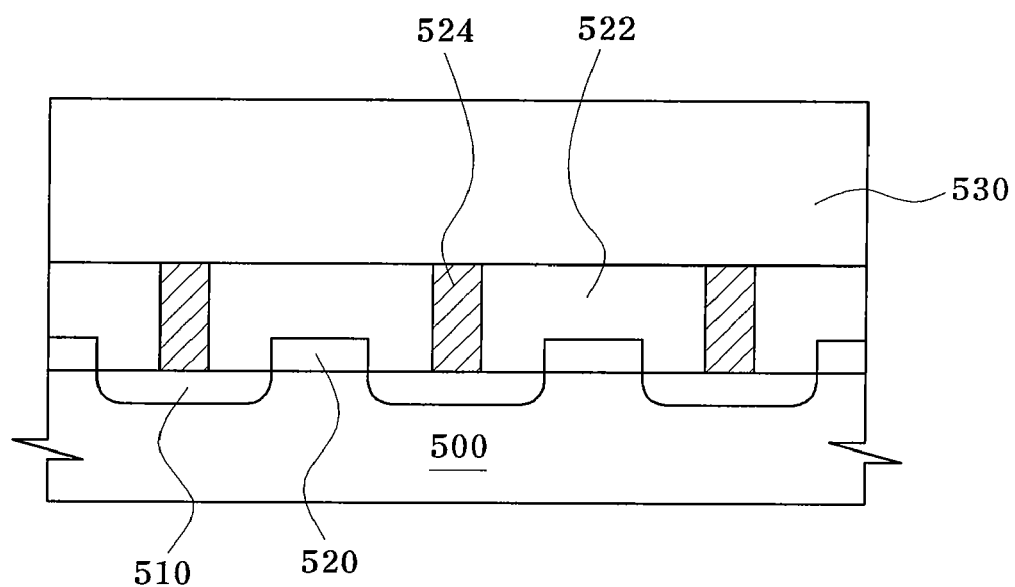
FIGS. 4 to 7 are sectional views illustrating a method for forming storage node contacts in a semiconductor device in accordance with another embodiment of the present invention.

Referring to FIG. 4A, a first dielectric layer 522 is formed over a semiconductor substrate 500. The substrate has conductive regions 510. Gate structures 520 of transistors are disposed over the semiconductor substrate 500. The gate structures are disposed within the first dielectric layer 522. The conductive regions 510 are source/drain regions of the transistors. Landing plug contacts (LPC) 524 are formed through the first dielectric layer 522. Each of the LPCs 524 contacts the corresponding conductive region 510 of the semiconductor substrate 500. The LPCs 524 are obtained by a general self-aligned contact forming process in the present embodiment.

A second dielectric layer 530 is formed over the first dielectric layer 522 and the LPCs 524. The second dielectric layer 530 may be a high density plasma (HDP) oxide layer.

Figure 4B:
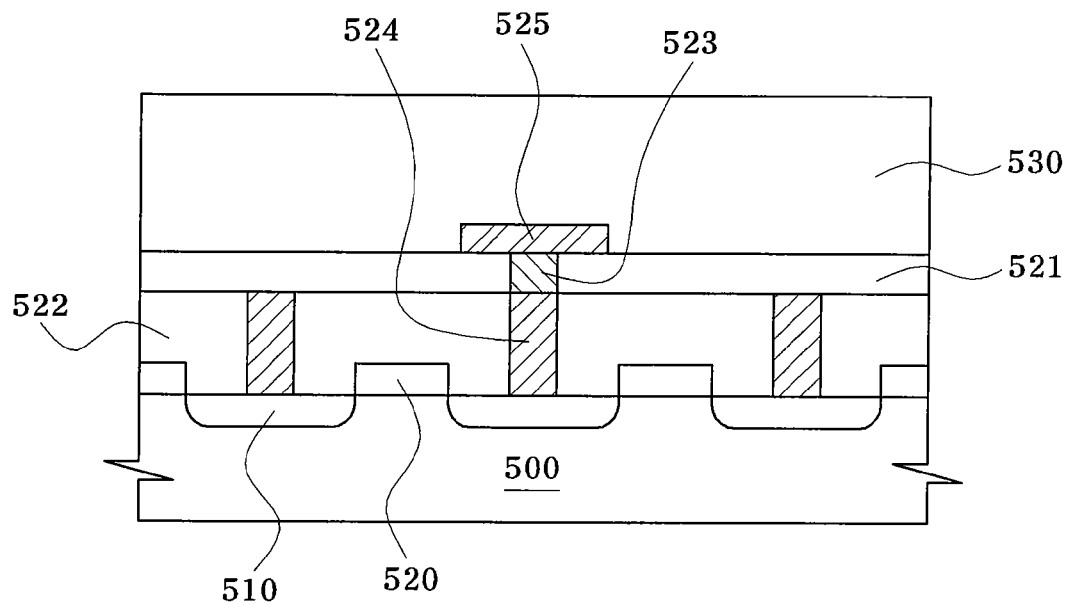

As shown in FIG. 4B, a bit line 525 is formed before the second dielectric layer 530 is formed over the first dielectric layer 522. A bit line contact insulation layer 521 and a bit line plug 523 provided over the LPCs 524. The bit line 525 contacts the bit line plug 523.

Figure 5:
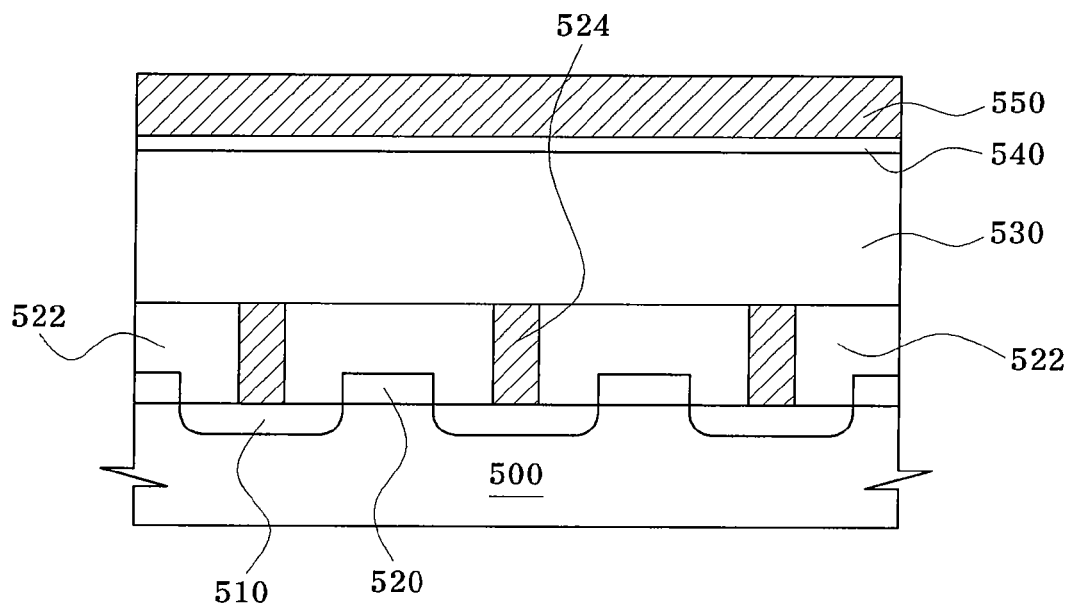

Referring to FIG. 5, a hydrogen diffusion preventing layer 540 is formed over the second dielectric layer 530. The hydrogen diffusion preventing layer 540 has a thickness of approximately 100~1,000 Å, and is a silicon-rich oxide (SROX) layer. The SROX layer is formed by plasma enhanced chemical vapor deposition (PE-CVD). More specifically, in the PE-CVD, $SiH_4$ gas, $N_2O$ gas and $N_2$ gas are used as reaction gases, a chamber is maintained at a temperature of approximately 350~450° C. and a pressure of approximately 2~4 Torr, and an RF power of approximately 400~1,000 W is applied to the chamber so as to form plasma in the chamber. The supply amount of the $SiH_4$ gas is adjusted to approximately 300~500 sccm, and the supply amounts of the $N_2O$ gas and the $N_2$ gas are respectively adjusted to approximately 4,000~6,000 sccm. Then, a hard mask layer 550 is formed on the hydrogen diffusion preventing layer 540. The hard mask layer 550 is a silicon-rich oxy-nitride (SRON) layer and has a large amount of hydrogen atoms.

Figure 6:
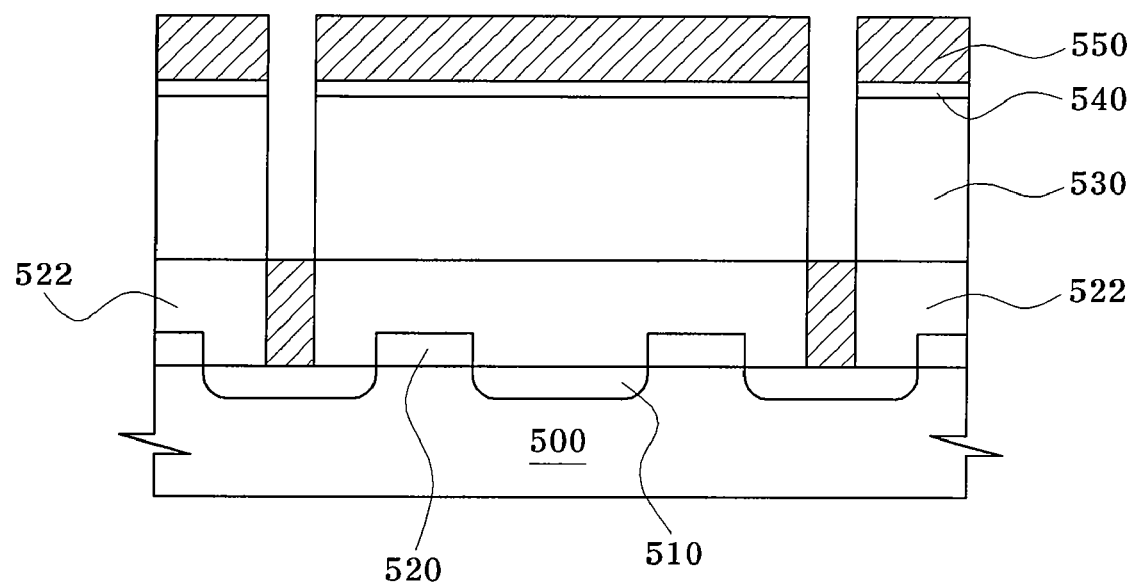

Referring to FIG. 6, the hard mask layer 550 is patterned to expose the hydrogen diffusion preventing layer 540 and the second dielectric layer 530. The exposed portions of the hydrogen diffusion preventing layer 540 and the second interlayer dielectric layer 530 are etched to form capacitor contact holes 560. The capacitor contact holes 560 expose the LPCs 524 formed over the semiconductor substrate 500.

Figure 7:
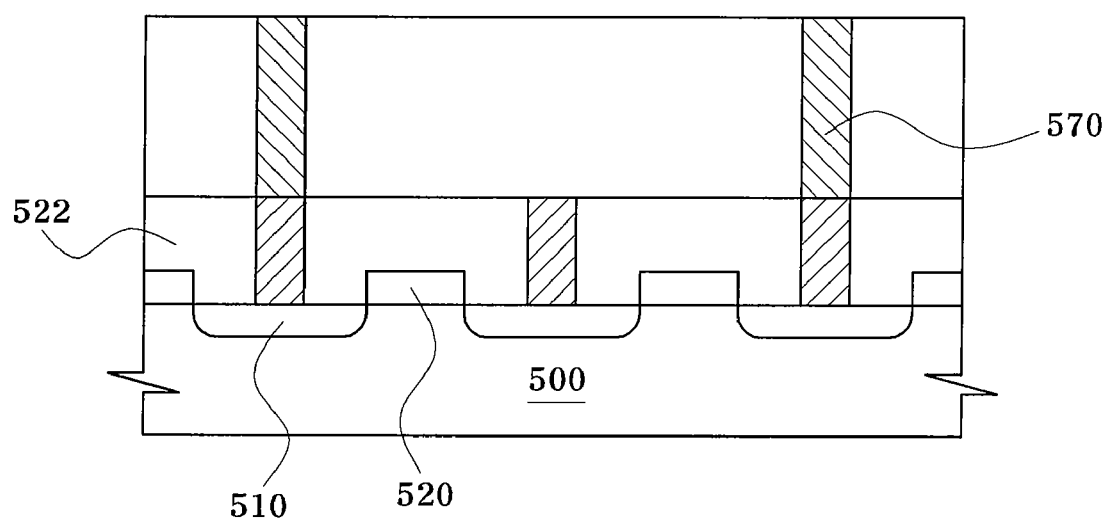

Referring to FIG. 7, the capacitor contact holes 560 are filled with a conductive layer to form capacitor contacts 560. In the present embodiment, the hard mask layer 550 and the hydrogen diffusion preventing layer 540 are removed before the conductive layer is deposited. In other implementations, the layers 540 and 550 may be removed after the conductive layer has been deposited.

Embodiments of the present invention provide a method for forming capacitor contacts in a semiconductor device, in which a hydrogen diffusion barrier layer is formed below a hard mask layer containing a large amount of hydrogen atoms, thus preventing the hydrogen atoms in the hard mask layer from being diffused into a gate oxide layer during a process for forming the storage node contacts. The present embodiments provide stable electrical characteristics of transistors without influencing the electrical characteristics of the transistors.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of forming a semiconductor device, the method comprising:

forming a dielectric layer over a transistor provided on a semiconductor substrate, the transistor having first and second conductive regions and a gate provided between the first and second conductive regions;

forming a hydrogen diffusion preventing layer over the dielectric layer;

forming a hard mask layer containing silicon of 37.5 to 43 percentage over the hydrogen diffusion preventing layer, the hard mask layer including hydrogen atoms that are byproducts of the formation of the hard mask layer;

etching the hydrogen diffusion preventing layer and the dielectric layer using the hard mask layer to form a trench until the first conductive region of the transistor is exposed; and filling the trench with conductive material to form a contact plug for a capacitor.

2. The method according to claim 1, wherein the hydrogen diffusion preventing layer is a silicon-rich oxide (SROX) layer.

3. The method according to claim 2, wherein the SROX is formed using a plasma enhanced chemical vapor deposition method.

4. The method according to claim 3, wherein the plasma enhanced chemical vapor deposition method uses $SiH_4$ gas, $N_2O$ gas and $N_2$ gas as reaction gases in a chamber at a temperature of 350~450° C. with a pressure of 2~4 Torr, wherein an RF power of 400~1,000 W is applied to the chamber to form plasma in the chamber.

5. The method according to claim 4, wherein a flow rate of the $SiH_4$ gas is 300~500 sccm, and each flow rate of the $N_2O$ gas and the $N_2$ gas is 4,000~6,000 sccm.

6. The method according to claim 1, wherein the hydrogen diffusion preventing layer has a thickness of 100~1,000 Å.

7. The method according to claim 1, wherein the hard mask layer containing hydrogen atoms is a silicon-rich oxy-nitride (SRON) layer.

8. The method according to claim 1, wherein the dielectric layer is a high density plasma oxide layer.

9. A method of forming a semiconductor device comprising:
    forming a first dielectric layer over a transistor provided on a semiconductor substrate, the transistor having first and second conductive regions and a gate provided between the first and second conductive regions;
    etching the first dielectric layer to form first and second landing plug trenches;
    filling the first and second landing plug trenches with conductive material to form first and second landing plugs, respectively;
    forming a second dielectric layer over the first and second landing plugs;
    forming a hydrogen diffusion preventing layer over the second interlayer dielectric layer;
    forming a hard mask layer containing silicon of 37.5 to 43 percentage over the hydrogen diffusion preventing layer, the hard mask layer including hydrogen atoms that are byproducts of the formation of the hard mask layer;
    etching the hydrogen diffusion preventing layer and the second dielectric layer using the hard mask layer to form a contact plug trench until the first landing plug is exposed; and
    filling the contact plug trench with conductive material to form a contact plug for a capacitor, the contact plug contacting the first landing plug.

10. The method according to claim 9, wherein the hydrogen diffusion preventing layer is a silicon-rich oxide (SROX) layer, the hydrogen diffusion preventing layer being used to hinder the hydrogen atoms from diffusing down to the transistor.

11. The method according to claim 9, wherein the hard mask layer is a silicon-rich oxy-nitride (SRON) layer.

12. The method according to claim 9, further comprising:
    forming an insulating layer over the first and second landing plugs;
    etching the insulating layer to form a bit line trench to expose the second landing plug; and
    providing conductive material within the bit line trench to form a bit line having a bit line plug that contacts the second landing plug.

13. The method according to claim 12, wherein the conductive material includes one selected from polysilicon and tungsten.

14. A method of forming a semiconductor device comprising:
    forming a first dielectric layer over a transistor provided on a semiconductor substrate, the transistor having first and second doped regions and a gate provided between the first and second doped regions;
    forming a hydrogen diffusion preventing layer over the first dielectric layer;
    forming a hard mask layer containing silicon of 37.5 to 43 percentage over the hydrogen diffusion preventing layer, the hard mask layer including hydrogen atoms that are byproducts of the formation of the hard mask layer;
    etching the hydrogen diffusion preventing layer and first dielectric layer using the hard mask layer to form a contact plug trench until a conductive region is exposed; and
    filling the contact plug trench with conductive material to form a contact plug for a capacitor, the contact plug contacting the conductive region.

15. The method of claim 14, further comprising:
    forming a second dielectric layer over the transistor, the second dielectric layer being provided between the semiconductor substrate and the first dielectric layer;
    etching the second dielectric layer to form first and second landing plug trenches;
    filling the first and second landing plug trenches with conductive material to form first and second landing plugs, respectively,
    wherein the conductive region exposed by the contact plug trench is an upper surface of the first landing plug.

16. The method of claim 15, further comprising:
    forming an insulating layer over the first and second landing plugs, the insulating layer being provided between the first and second dielectric layers;
    etching the insulating layer to form a bit line trench to expose the second landing plug; and
    providing conductive material within the bit line trench to form a bit line having a bit line plug that contacts the second landing plug.

* * * * *